US007425941B2

(12) United States Patent
Sung et al.

(10) Patent No.: US 7,425,941 B2
(45) Date of Patent: Sep. 16, 2008

(54) SOURCE DRIVER OF LIQUID CRYSTAL DISPLAY

(75) Inventors: Yoo-Chang Sung, Chungcheongbuk-do (KR); Jong-Kee Kim, Chungcheongbuk-do (KR)

(73) Assignee: MagnaChip Semiconductor, Ltd., Chungcheongbuk-Do (KR)

( * ) Notice: Subject to any disclaimer, the term of this patent is extended or adjusted under 35 U.S.C. 154(b) by 542 days.

(21) Appl. No.: 11/073,168

(22) Filed: Mar. 4, 2005

(65) Prior Publication Data

US 2006/0023001 A1 Feb. 2, 2006

(30) Foreign Application Priority Data

Jul. 30, 2004 (KR) ...................... 10-2004-0060389

(51) Int. Cl.
*G09G 3/36* (2006.01)
*G09G 5/10* (2006.01)
*H03M 1/66* (2006.01)

(52) U.S. Cl. ......................... 345/98; 345/210; 345/690; 341/144

(58) Field of Classification Search ......... 345/690–697, 345/87–100, 204–210; 341/144–145
See application file for complete search history.

(56) References Cited

U.S. PATENT DOCUMENTS

| | | | | |
|---|---|---|---|---|
| 5,111,205 | A * | 5/1992 | Morlon | 341/156 |
| 5,703,588 | A * | 12/1997 | Rivoir et al. | 341/159 |
| 5,952,948 | A * | 9/1999 | Proebsting | 341/144 |
| 5,977,898 | A * | 11/1999 | Ling et al. | 341/144 |
| 6,268,817 | B1 * | 7/2001 | Min et al. | 341/145 |

* cited by examiner

*Primary Examiner*—David L Lewis
(74) *Attorney, Agent, or Firm*—Blakely, Sokoloff, Taylor & Zafman LLP

(57) ABSTRACT

A TFT-LCD source driver for driving L channels of a liquid crystal panel (where L is a positive integer), the TFT-LCD source driver comprising a plurality of DACs (digital-to-analog converters) for converting (M+N)-bit different digital signals into analog signals (where M and N are positive integers), the DAC including: a coarse gradation voltage generator, configured with $2^M$ resistors connected in series, for generating $2^M$ gradation voltages; a first decoder for selecting two consecutive voltages among the $2^M$ gradation voltages in response to M-bit digital signals; a fine gradation voltage generator, configured with $2^N$ resistors connected in series, for receiving output voltages of the first decoder and outputting $2^N$ gradation voltages; and a second decoder for selecting one of the $2^N$ gradation voltages in response to the N-bit digital signals and outputting the selected gradation voltage as the analog signal.

6 Claims, 12 Drawing Sheets

SOURCE DRIVER OF LIQUID CRYSTAL DISPLAY

FIELD OF THE INVENTION

The present invention relates to a source driver of a TFT-LCD or TFT-OELD; and, more particularly, to a source driver of a LCD, which is capable of improving an accuracy and resolution.

DESCRIPTION OF RELATED ART

FIG. 1 is a block diagram of a general TFT-LCD (thin film transistor—liquid crystal display).

Referring to FIG. 1, the TFT-LCD includes a liquid crystal panel 400, a timing controller 100, a plurality of gate drivers 200, a plurality of source drivers 300, and a voltage generator 500.

The plurality of gate drivers 200 are enabled by the timing controller 100 and sequentially drives gate lines of the liquid crystal panel 400. The plurality of source drivers 300 are enabled by the timing controller 100 and drives source lines of the liquid crystal panel 400 to allow the liquid crystal panel 400 to display data. The voltage generator 500 generates various voltages that the system requires.

The liquid crystal panel 400 has a plurality of unit pixels, each of which consists of a liquid crystal capacitor C1 and a switching thin film transistor T1. The unit pixels are arranged in matrix. Sources of the thin film transistors T1 are respectively connected to the source lines that are driven by the source driver 300, and gates of the thin film transistors T1 are respectively connected to the gate lines that are driven by the gate driver 200.

In such a TFT-LCD, the gate driver 200 sequentially drives the gate lines under control of the timing controller 100, and the source driver 300 receives data from the timing controller 100 and applies an analog signal to the source lines. In this manner, the TFT-LCD displays the data.

FIG. 2 is a block diagram of the source driver 300 of the TFT-LCD shown in FIG. 1.

Referring to FIG. 2, the source driver 300 includes a digital controller 310, a register 320 for storing digital data provided from the digital controller 310, a level shifter 330 for converting a level of a signal provided from the register 320, a digital-to-analog converter (DAC) 340 for converting a digital signal passing through the level shifter 330 into an analog signal, an analog bias part 350, and a buffering part for buffering an output of the DAC 340 by a bias provided from the analog bias part 350 and supplying it to the source lines of the liquid crystal panel (400 in FIG. 1).

The digital controller 310 receives a source driver start pulse (SSP), a data clock and a digital data from the timing controller (100 in FIG. 1), transfers the digital data to the register 320, and controls the register 320.

The register 320 includes a shift register 321, a sampling register 322 and a holding register 323. All digital data are stored in the sampling register 322 through the shifter register 321. The digital data stored in the sampling register 322 are transferred to the DAC 340 through the holding register 323 and the level shifter 330 in response to a control signal LOAD provided from the timing controller (100 in FIG. 1).

The DAC 340 includes a gradation voltage generator 342 for making an input voltage nonlinearly so as to express brightness linearly, and a decoder 344 for decoding an output of the gradation voltage generator 342 by using the digital signal passing through the level shifter 330 as a select signal.

The buffering part 360 is configured with a unity gain amp and supplies a signal having the same voltage level as the analog signal to the source lines of the liquid crystal panel at higher power.

FIG. 3 is a circuit diagram of the DAC shown in FIG. 2.

Referring to FIG. 3, the respective outputs of the gradation voltage generator 342 are selected through six switches 344 connected in sequence and are then outputted. In this manner, since the gradation voltage is selected through the six switches controlled by the digital signals D<6:1>, a separate decoder is not required.

FIG. 4 is a circuit diagram of another conventional DAC. The respective outputs of the gradation voltage generator 342 are selected through one switch and are outputted as the analog signal AN_OUT. Accordingly, there is required a 6 64 decoder for generating a control signal to control the respective switches.

Also, various DACs can be implemented by combining the DACs shown in FIGS. 3 and 4. That is, the DAC having a 6-bit resolution can use one switch to maximum six switches connected in series at the respective outputs, and a 6×64 decoder for generating the control signal can be used. Also, a structure having no decoder can be provided. For example, two switches serially connected to the respective outputs can be used and two 3×8 decoders can be used to select the respective switches. Alternatively, three switches connected in series can be used and three 2×4 decoders can be used.

Meanwhile, 64 resistors are required so as to obtain a 6-bit resolution by using the DAC 340, and the decoder and the switch are required so as to select the gradation voltage. Accordingly, if the DAC is implemented to have an 8-bit or 10-bit resolution, a circuit area increases about 4 times or 16 times. That is, in order to increase a resolution by N-bit, the circuit area increases $2^N$ times.

Like this, if the area of the DAC 340 increases, the area of the TFT-LCD driver chip increases, so that a manufacturing cost rises. Consequently, price competitiveness is reduced.

Accordingly, in order to minimize the increase of the circuit area, the DAC is implemented with two stages, which will be described below with reference to the accompanying drawings.

FIG. 5 is a circuit diagram of a conventional two-stage DAC. A first DAC 346 converts the upper 6-bit digital signals D<8:3> into the analog signals and includes a resistor string 346*a* for dividing an upper voltage VREF_H and a lower voltage VREF_L, and a decoder 346*b* for outputting two consecutive analog voltages $V_{N+1}$ and $V_N$ in response to the digital signals D<2:1>. A second DAC 347 converts the lower 2 bits D<2:1> and includes a capacitor part 347 for dividing voltage levels of the two analog voltages $V_{N+1}$ and $V_N$ and a switching part 347*a* for controlling the voltage levels divided through the capacitors 347*b*.

The resistor string 346*a* of the first DAC is shared and is the gradation voltage generator 342 shown in FIG. 2.

However, in the case of the DAC implemented with the capacitors, the accuracy of the output signal is lowered. This is caused by charge injection and clock feedthrough, which occur in the switches connected to the capacitors. The error of the output voltage due to the charge injection and clock feedthrough is proportional to the driving voltage of the MOS transistors used as the switches. Since the TFT-LCD uses a voltage of 7-16 V as the driving voltage, it is difficult to meet the accuracy aimed at the design. Although the accuracy can be improved by increasing the capacitance, the circuit area is increased and the operating speed is reduced.

In order to solve these problems, the two-stage DACs are respectively implemented with the resistor string, as shown in FIG. 6.

Referring to FIG. 6, first and second DACs 348 and 350 include resistor strings 348*a* and 350*a* for dividing the applied voltage and switching parts 348*b* and 350*b* for outputting the analog voltages corresponding to the digital signals D<8:3> and D<2:1> among the voltages outputted by the resistor strings 348*a* and 350*a*.

The first and second DACs 348 and 350 are connected through the unity gain amp 349, so that the divided voltage level of the front stage cannot be influenced by the resistor string 350*a* of the rear stage. That is, since the resistor strings 348*a* and 350 of the first and second stages are connected in parallel through the switching parts 348*b* and 350*b*, it is possible to solve the problem that the outputted analog signals cannot have voltage level difference of a constant ratio and thus the analog signals corresponding to the digital signals cannot be outputted.

Meanwhile, since the accuracy of the unity gain amp designed in a general CMOS process is about 20 mV. Therefore, if the DAC is implemented with such a unity gain amp, it is difficult to expect the accuracy of about 20 mV or more in the 6-bit resolution.

In addition, since two unity-gain amps are added to the channel, the circuit area is increased.

Therefore, due to the offset voltage of the unity gain amp, the DAC implemented with the unity gain amp has a limit in designing the high gradation DAC having the accuracy of more than the offset voltage of the unity gain amp.

SUMMARY OF THE INVENTION

It is, therefore, an object of the present invention to provide a source driver of a liquid crystal display, capable of improving an accuracy and resolution without using a unity gain amp in a DAC.

In accordance with an aspect of the present invention, there is provided a TFT-LCD source driver for driving L channels of a liquid crystal panel (where L is a positive integer), the TFT-LCD source driver comprising a plurality of DACs (digital-to-analog converters) for converting (M+N)-bit different digital signals into analog signals (where M and N are positive integers), the DAC including: a coarse gradation voltage generator, configured with resistors connected in series, for generating $2^M$ gradation voltages; a first decoder for selecting two consecutive voltages among the $2^M$ gradation voltages in response to M-bit digital signals; a fine gradation voltage generator, configured with $2^N$ resistors connected in series, for receiving output voltages of the first decoder and outputting $2^N$ gradation voltages; and a second decoder for selecting one of the $2^N$ gradation voltages in response to the N-bit digital signals and outputting the selected gradation voltage as the analog signal.

In accordance with another aspect of the present invention, there is provided a An apparatus for converting a digital signal into an analog signal, including: L DACs (digital-to-analog converters) including: a first decoder for selecting two consecutive voltages among the $2^M$ gradation voltages in response to M-bit digital signals; a fine gradation voltage generator, configured with $2^N$ resistors connected in series, for receiving output voltages of the first decoder and outputting $2^N$ gradation voltages; and a second decoder for selecting one of the $2^N$ gradation voltages in response to the N-bit digital signals and outputting the selected gradation voltage as the analog signal; and a coarse gradation voltage generator, configured with $2^M$ resistors connected in series, for generating $2^M$ gradation voltages, wherein the first decoder and the fine gradation voltage generator are connected together without unity gain amp; and a resistance ($R_{ch}$) of the fine gradation voltage generator meets an equation $$R_{ch} \geq \frac{(2^M - 1) \cdot L \cdot R}{2^M \cdot 2^N},$$

where R is a resistance of the coarse gradation voltage generator.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Hereinafter, the present invention will be described in detail with reference to the accompanying drawings.

Figure 7:
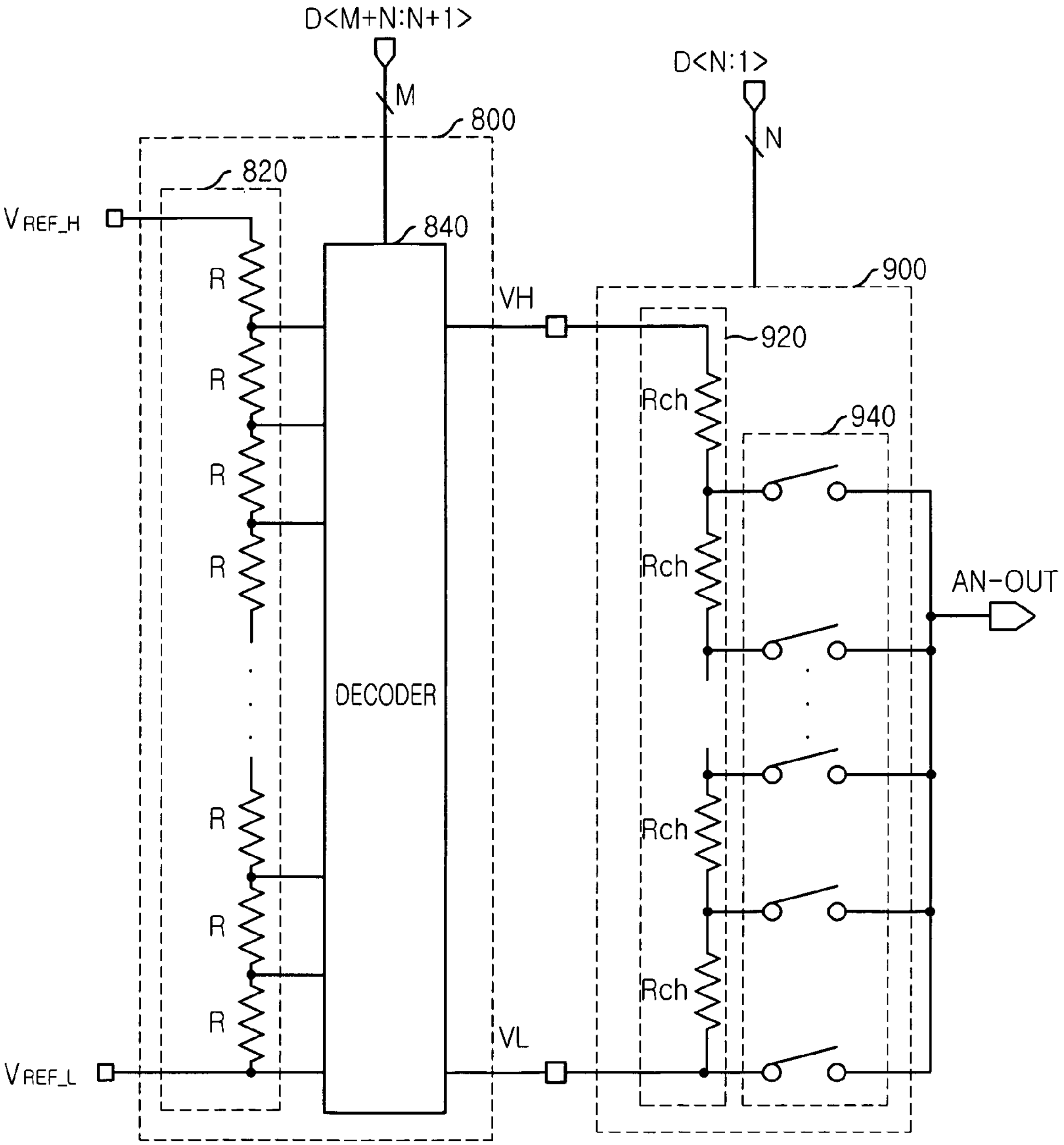
FIG. 7 is a circuit diagram of a DAC in accordance with an embodiment of the present invention.

FIG. 7 is a circuit diagram illustrating a DAC of a source driver in accordance with an embodiment of the present invention.

Referring to FIG. 7, the DAC includes a coarse gradation voltage generator 820, a first decoder 840, a fine gradation voltage generator 920, and a second decoder 940.

The coarse gradation generator 820 is configured with $2^M$ resistors connected in series and generates $2^M$ gradation voltages. The first decoder 840 selects two consecutive voltages (for example, VH and VL) among the output voltages of the coarse gradation voltage generator 820 in response to M-bit digital signals D<M+N:N+1>. The fine gradation voltage generator 920 is configured with $2^N$ resistors connected in series, and receives the output voltages of the first decoder 840 and outputs $2^N$ gradation voltages. The second decoder 940 selects one output voltage among the output voltages of the fine gradation voltage generator 920 and outputs an analog signal AN_OUT in response to N-bit digital signals D<N:1>.

A first DAC 800 includes the coarse gradation voltage generator 820 and the first decoder 840, and a second DAC 900 includes the fine gradation voltage generator 920 and the second decoder 940. (M+N) digital signals D<M+N:1> are converted into the analog signals AN_OUT through two stages, that is, the first and second DACs 800 and 900.

Here, the coarse gradation voltage generator 820 is shared by L DACs, which drive L channels of the liquid crystal panel.

Figure 1:
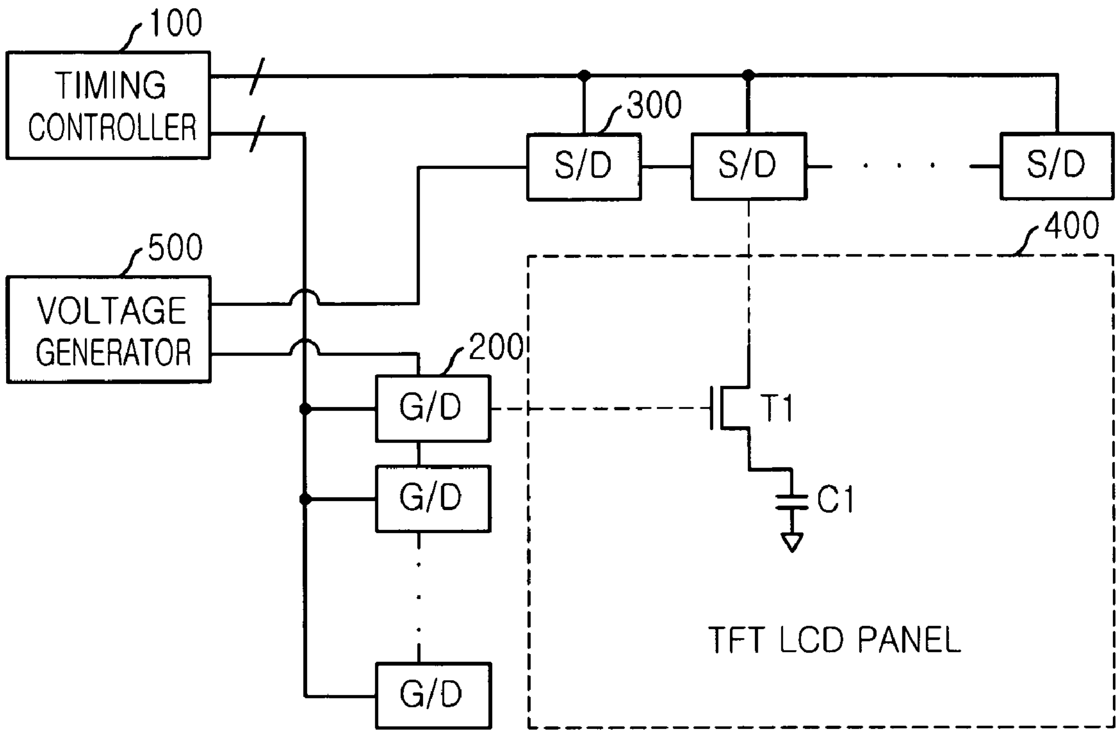
FIG. 1 (PRIOR ART)
FIG. 1 is a block diagram of a general TFT-LCD.
Figure 2:
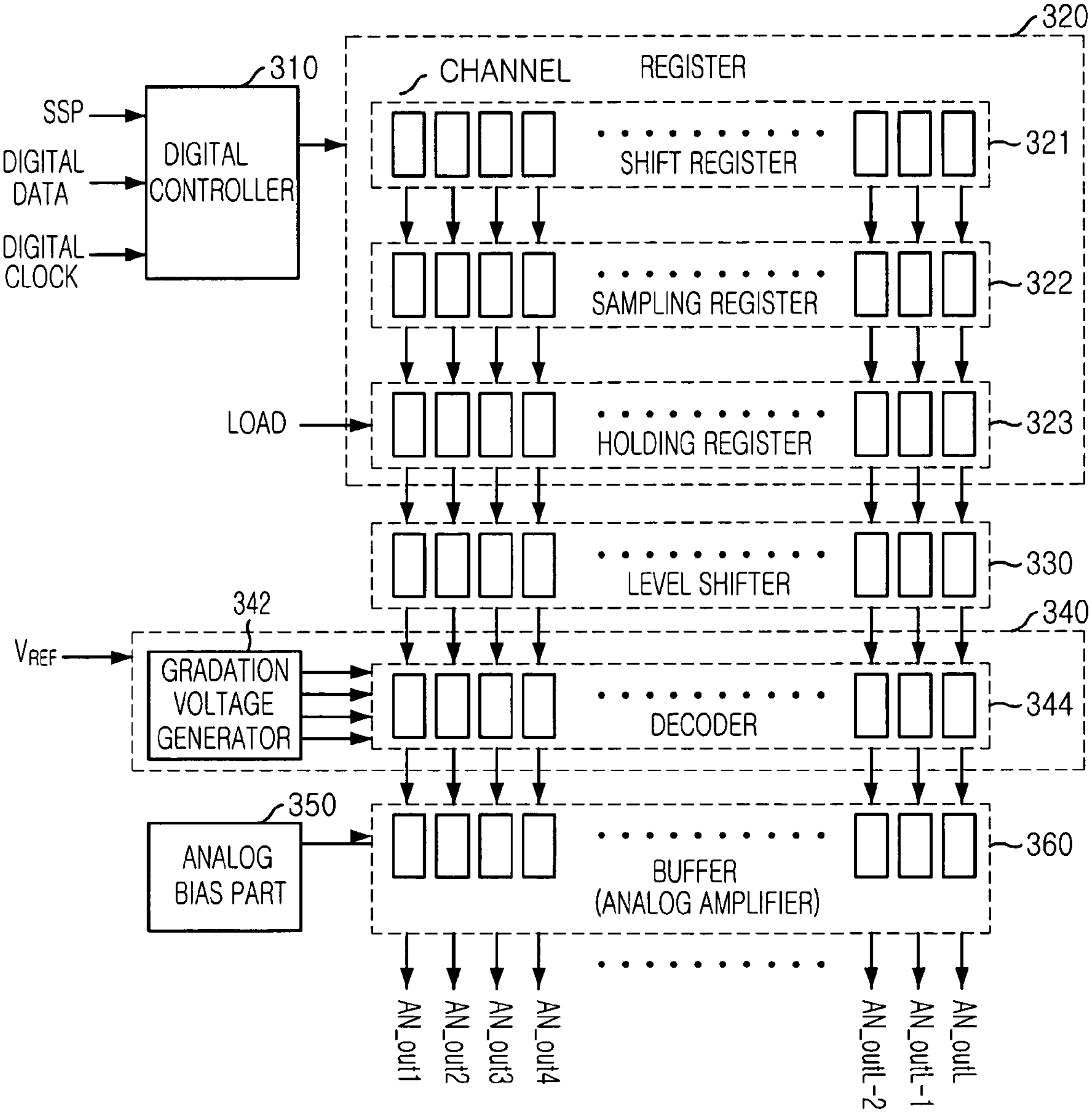
FIG. 2 (PRIOR ART)
FIG. 2 is a block diagram of a source driver of the TFT-LCD shown in FIG. 1.
Figure 3:
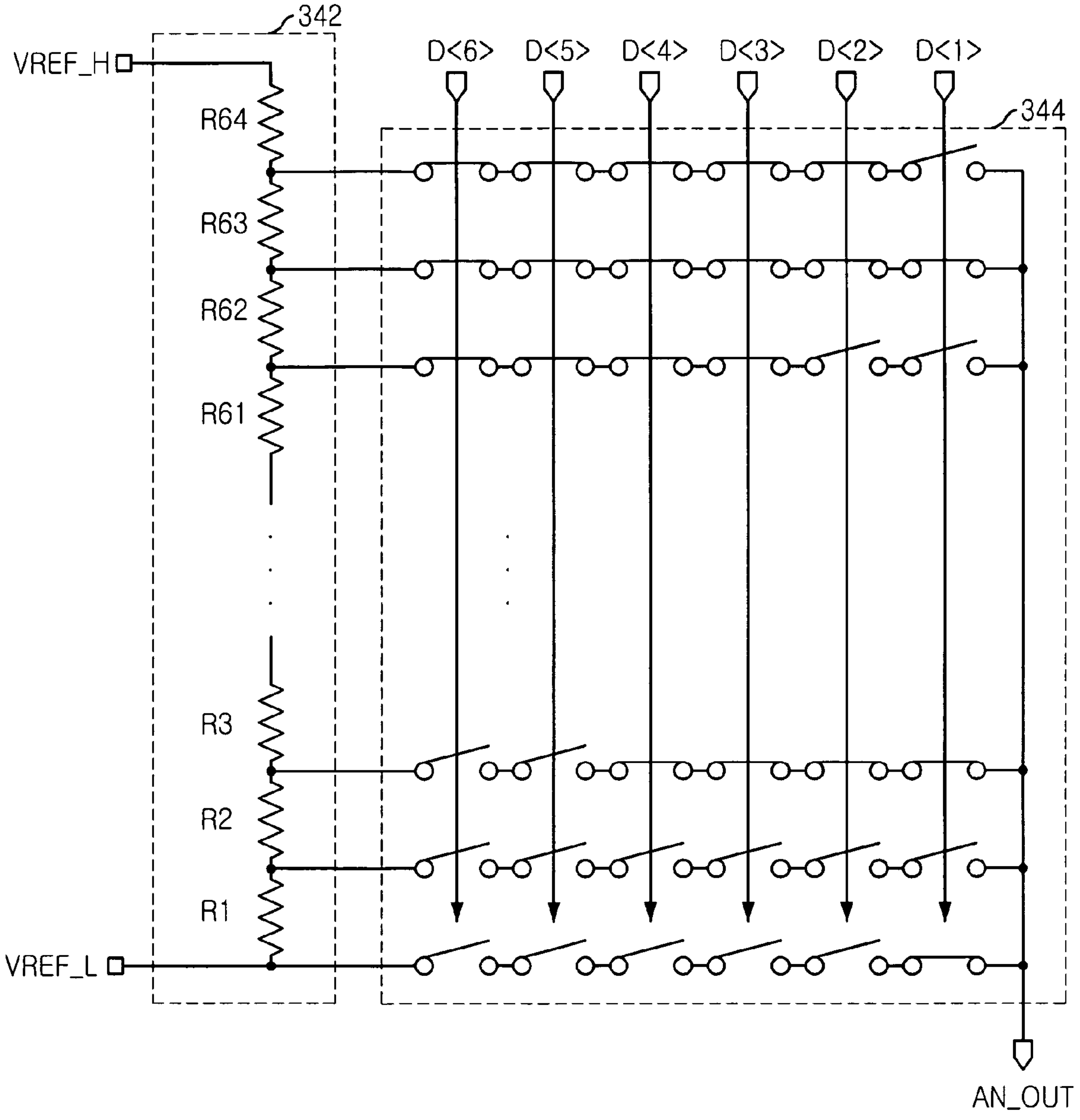
FIG. 3 (PRIOR ART)
FIG. 3 is a circuit diagram of a conventional DAC shown in FIG. 2.
Figure 4:
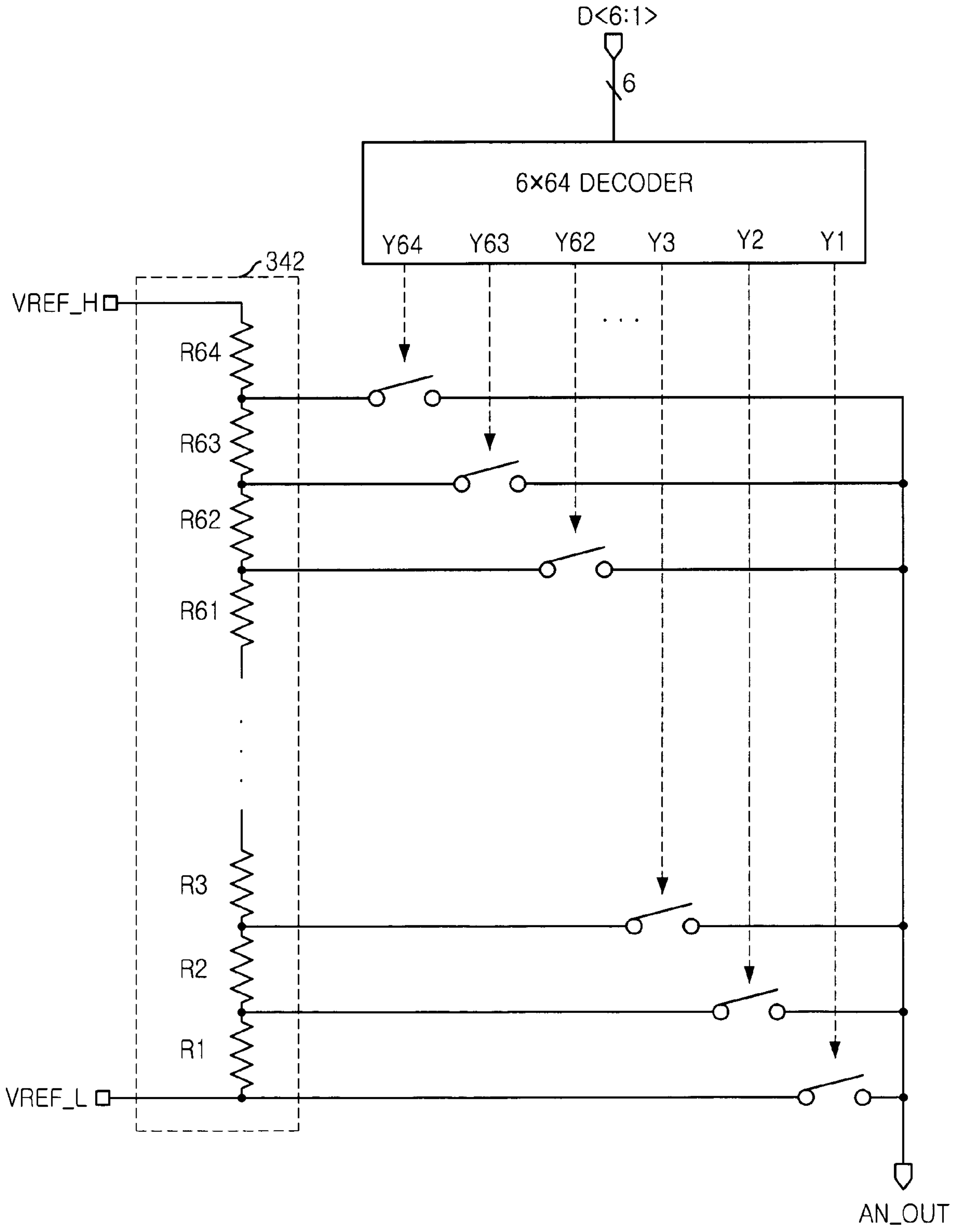
FIG. 4 (PRIOR ART)
FIG. 4 is a circuit diagram of another conventional DAC.
Figure 5:
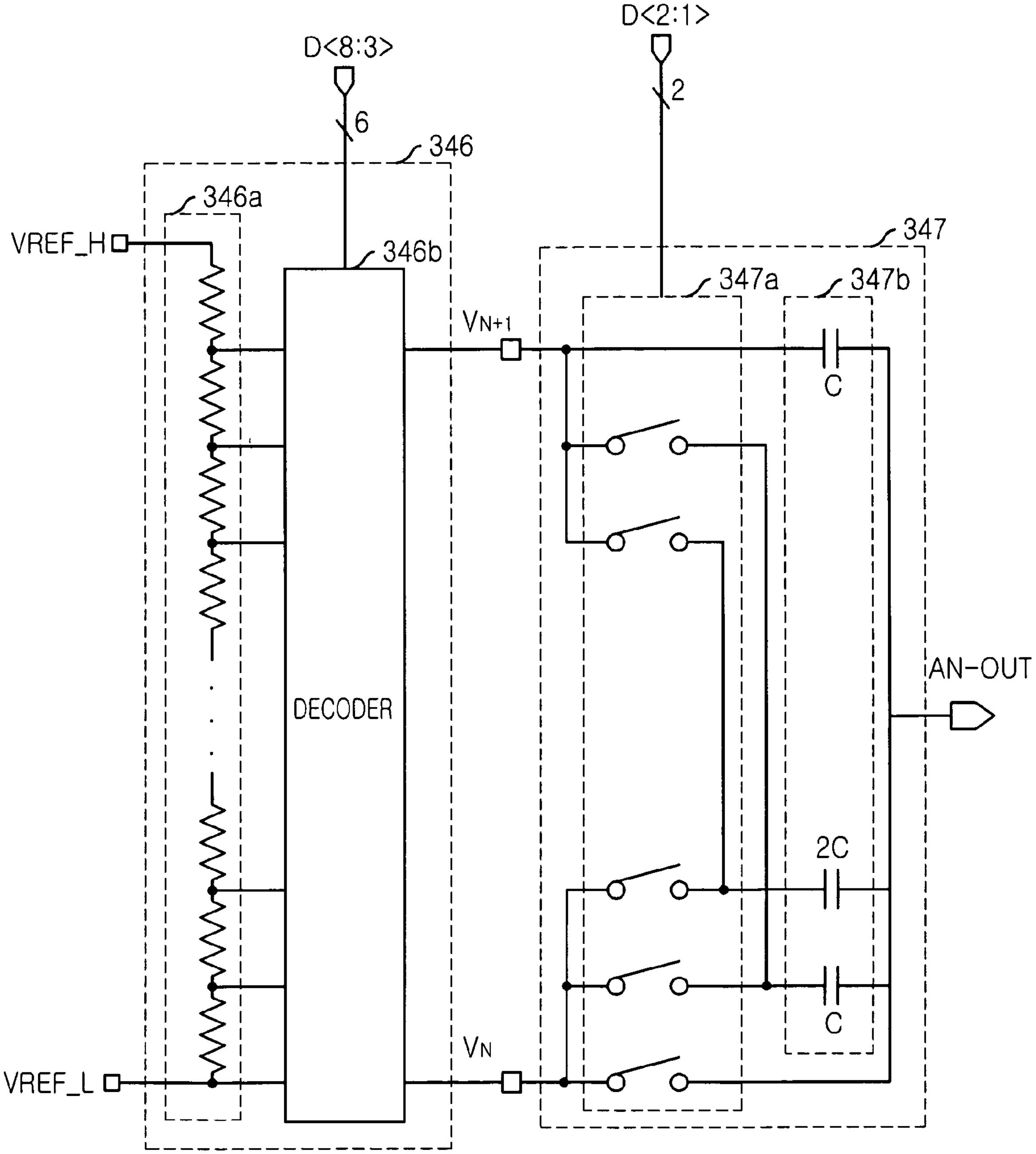
FIG. 5 (PRIOR ART)
FIG. 5 is a circuit diagram of a further another conventional DAC.
Figure 6:
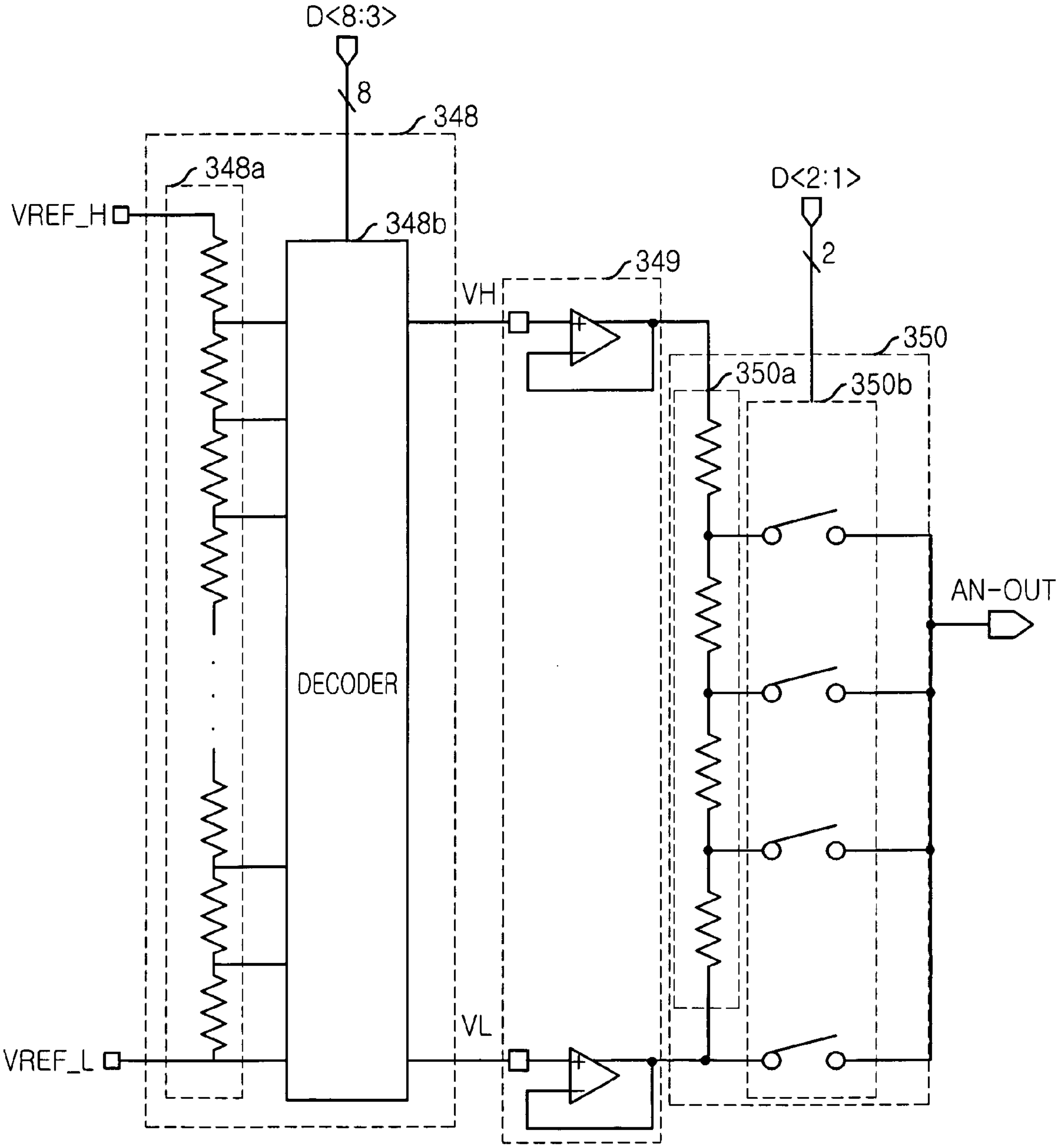
FIG. 6 (PRIOR ART)
FIG. 6 is a circuit diagram of a still further another conventional DAC.

Meanwhile, unlike the conventional DAC (refer to FIG. 6), the first decoder 840 and the fine gradation voltage generator 920 are connected together without any unity gain amp. Accordingly, the resistor string of the coarse gradation voltage generator 820 is connected in parallel to that of the fine gradation voltage generator 920. Therefore, in order to minimize the error due to the parallel connection, resistance Rch of the fine gradation voltage generator 920 must meet Equation 1 below.

$$R_{ch} \geq \frac{(2^M - 1) \cdot L \cdot R}{2^M \cdot 2^N} \quad \text{(Eq. 1)}$$

In Equation 1, R denotes the resistance of the coarse gradation voltage generator 820. If resistances are different, R denotes the largest resistance among them.

That is, the DAC of the source driver adjusts the resistance of the resistor string contained in the fine gradation voltage generator 920, which is connected in parallel without using the unity gain amp. Thus, the DAC of the source driver can minimize the influence of the parallel connection. Consequently, since there is no limit due to the offset voltage of the unity gain amp, the accuracy can be improved and the bits of the digital signal can be increased. In addition, the area occupied by the unity gain amp can be reduced.

Therefore, the high-gradation DAC having the high accuracy can be implemented.

Meanwhile, the resistance Rch of the fine gradation voltage generator 920 is a resistance given when a voltage level difference between an ideal voltage level $V_{1LSB}$ and an actual voltage level $V_{1LSB'}$ in a 1-bit digital signal meets Equation 2 below.

$$V_{1LSB} - V_{1LSB'} \leq \frac{1}{2} V_{1LSB} \quad \text{(Eq. 2)}$$

That is, the ideal voltage level $V_{1LSB}$ is a voltage level in case where the resistor string ratio of the front stage is not influenced by the resistor string of the rear stage, and the actual voltage level $V_{1LSB'}$ is a voltage level in case where the resistor string ratio of the front stage is influenced by the resistor string of the rear stage.

A degree of the output error is about ⅓$V_{1LSB}$. However, The degree of the output error can be reduced below ⅓$V_{1LSB}$ by changing the coefficient of Equation 2.

In addition, in case where the L channels output the same analog signals, the largest error occurs due to the influence of the parallel connection. In such a case, the resistor string of the L fine gradation voltage generators 920 is connected in parallel to one resistor of the coarse gradation voltage generator 820, as shown in FIG. 8.

Figure 8:
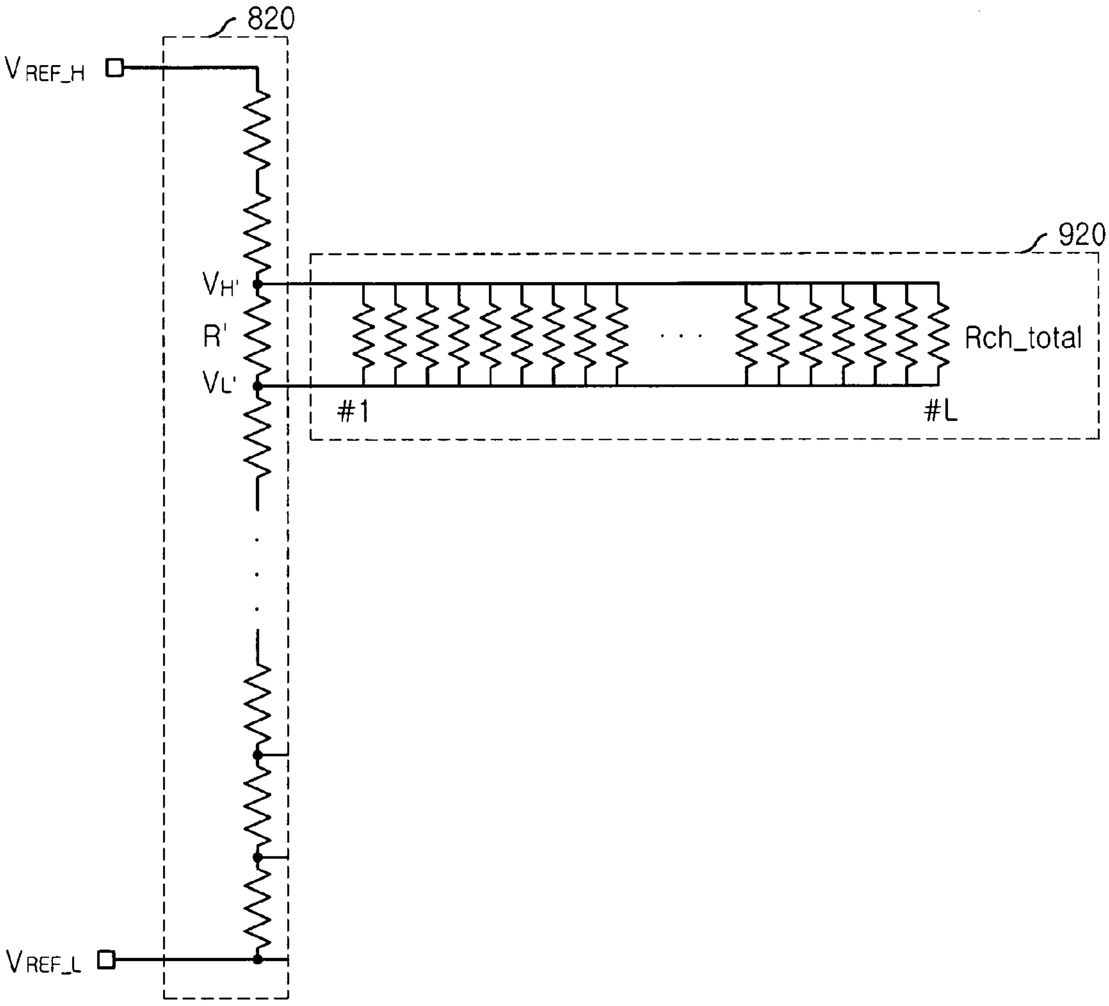
FIG. 8 is an equivalent circuit diagram of the DAC shown in FIG. 7 when an output error of the DAC is largest.

FIG. 8 is an equivalent circuit diagram of the DAC shown in FIG. 7, in which the resistor string of the L fine gradation voltage generator 920 are connected in parallel to the resistor string of the coarse gradation voltage generator 820 when the 1 channels generate the same output.

Referring to FIG. 8, it can be seen that the actual voltage level $V_{1LSB}$ corresponding to 1-bit digital signal has a relationship of $(VH'-VL')/2^N$ Accordingly, substituting in Equation 2, the result is given by $$(V_H - V_L) - (V_H' - V_L') \leq \frac{1}{2}(V_H - V_L) \quad \text{(Eq. 3)}$$

Referring to FIG. 8, $(V_H'-V_L')$ is a voltage applied on both terminals of the resistor R' of the coarse gradation voltage generator connected in parallel to the resistor string of the fine gradation voltage generator 920 and is R'×(VREF_H−VREF_L)/$R_{total}'$. In the ideal case, a voltage applied on both terminals of the resistor R of the coarse gradation voltage generator 820 is R×(VREF_H—VREF_L)/$R_{total}$. Accordingly, substituting in Equation 3, the result is given as Equation 4 below.

$$\left(\frac{R}{R_{total}}\right) - \left(\frac{R'}{R'_{total}}\right) \leq \frac{1}{2}\left(\frac{R}{R_{total}}\right) \quad \text{(Eq. 4)}$$

$R_{total}'$ denotes a total resistance of the coarse voltage generator 820 when the resistor string of the L fine gradation voltage generator 920 is connected in parallel to the resistor string of the coarse voltage generator 820. $R_{total}$ denotes a total resistance of $2^M$ serially-connected resistor strings connected of the coarse voltage generator 820.

Referring to FIG. 8, the total resistance $R_{total}'$ of the coarse voltage generator 820 is R×($2^M$−1)+R'. Also, in the ideal case, the total resistance $R_{total}$ of the coarse voltage generator 820 is R×$2^M$. Substituting in Equation 4, the result is obtained as follows.

$$\left(\frac{R}{R \times 2^M}\right) - \left(\frac{R'}{R \times (2^M - 1) + R'}\right) \leq \left(\frac{R}{R \times 2^{M+1}}\right) \quad \text{(Eq. 5)}$$

When the resistor strings of the L fine gradation voltage generators 920 are connected in parallel to the resistors of the fine gradation voltage generator 920, the resistance R' is given as $$R' = \frac{R \times \left(\frac{R_{ch\_total}}{L}\right)}{R + \left(\frac{R_{ch\_total}}{L}\right)}$$

$R_{ch\_total}$ denotes a total resistance of $2^N$ serially-connected resistor strings of the fine gradation voltage generator 920. Substituting in Equation 5, the result is obtained as follows.

$$R_{ch\_total} \geq \frac{(2^M - 1) \cdot L \cdot R}{2^M} \quad \text{(Eq. 6)}$$

The total resistance $R_{ch\_total}$ of the fine gradation voltage generator 920 is $R_{ch}$×$2^N$. Substituting in Equation 6, the result of Equation 1 can be obtained.

Meanwhile, when the resistor R1 and the resistor R2 are connected in parallel, a voltage level applied to the resistor R1||R2 becomes ½ of a voltage level applied to the resistor R1 when the resistor R2 has the same resistance as the resistor R1. That is, in view of the resistance of the fine gradation voltage generator 930, $R_{ch\_total}$/L=R, that is, $R_{ch\_total}$=R·L.

If $2^M-1\cong 2^M$ because M is sufficiently large in Equation 6, it can be intuitively seen that the resistance of the fine gradation voltage generator is identical to Equation 6.

As described above, if the DAC is implemented with two stages, the rear stage adjusts the resistance and thus the gap between the stages can be connected without any unity gain amp. Accordingly, since the limit in the accuracy of the DAC due to the offset voltage of the conventional unity gain amp can be removed, the DAC having high accuracy can be implemented. In addition, the unity gain amp required at channels can be removed, thereby reducing the area.

The first decoder 840 of the DAC is implemented with one MOS switch to M MOS switch arrays connected in series. It is presumed that a total resistance of an ideal first decoder 840 is 0Ω. However, the first decoder 840 of an actual DAC has a resistance that cannot be ignored compared with the resistance of the fine gradation voltage generator 920. A description will be made about a problem due to the resistance of the first decoder 840 actually implemented.

Figure 9:
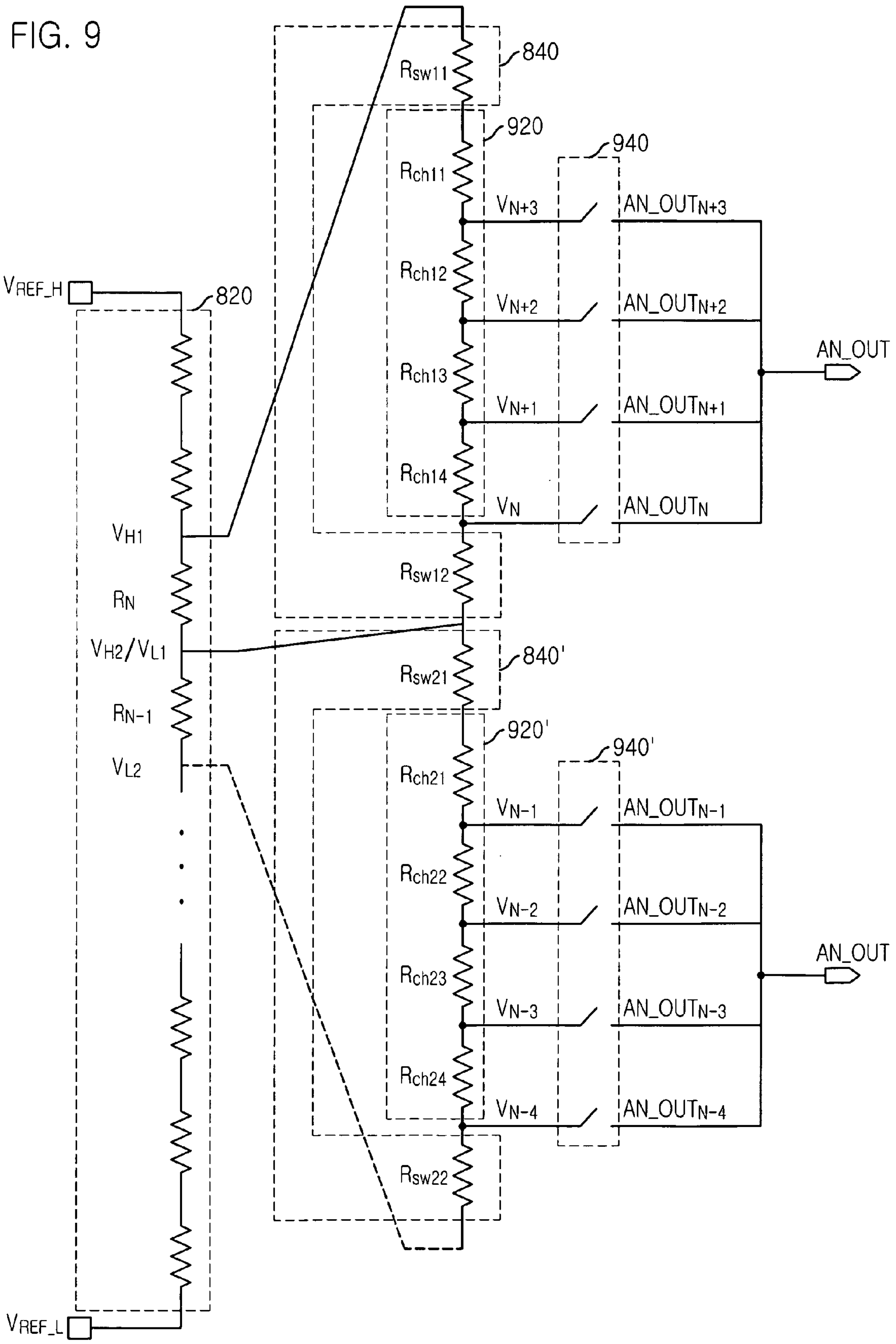
FIG. 9 is an equivalent circuit diagram of an actual DAC in accordance with an embodiment of the present invention.

FIG. 9 is an equivalent circuit diagram of a DAC in accordance with the present invention. The output voltages $V_{H1}$/$V_{L1}$ and $V_{H2}$/$V_{L2}$ from the adjacent resistors $R_N$ and $R_{N-1}$ of the coarse gradation voltage generator 820 is decoded by the fine gradation voltage generator 920.

As shown in FIG. 9, the resistors $R_{SW11}$/$R_{SW12}$ and $R_{SW21}$/$R_{SW22}$ respectively connected to both ends of the resistor strings of the fine gradation voltage generators 920 and 920' are turn-on resistors within the first decoders 840 and 840'.

Figure 10:
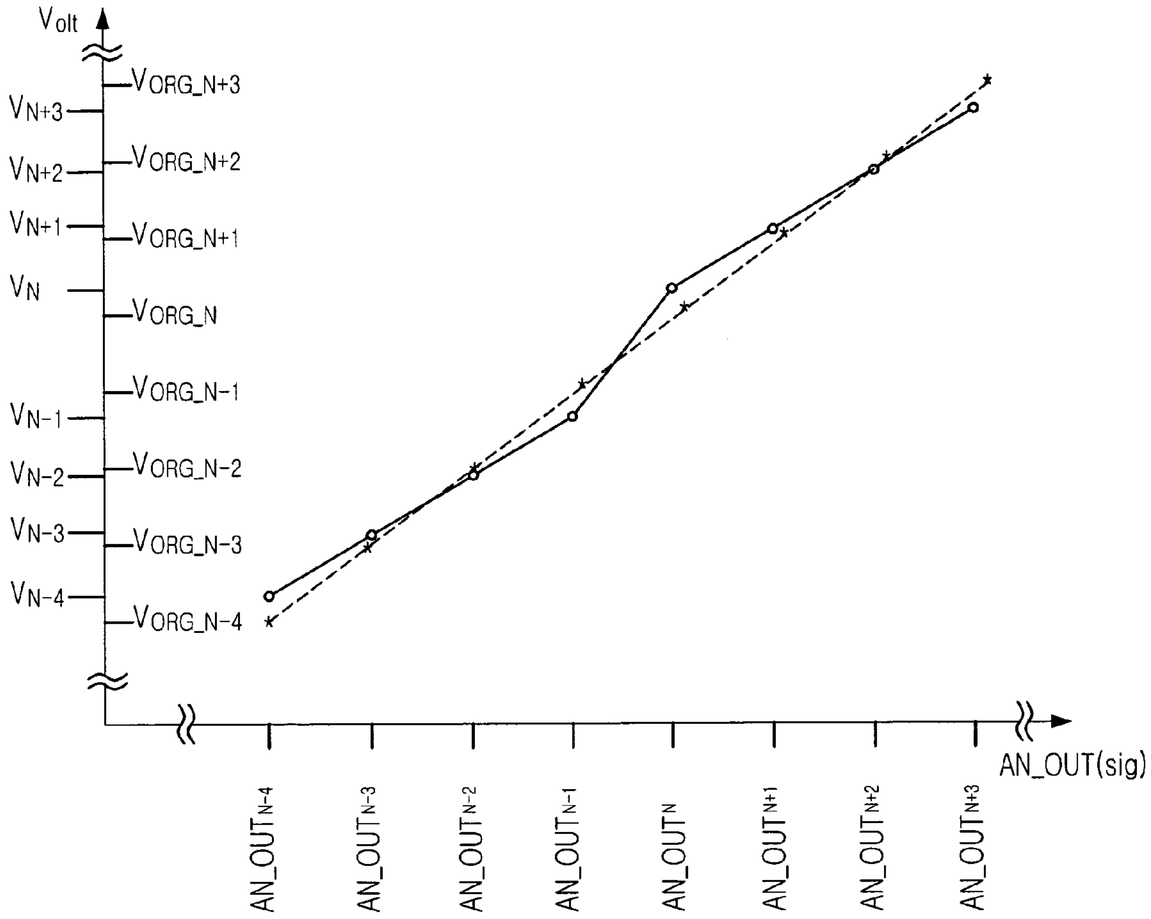
FIG. 10 is a graph illustrating an output voltage of the DAC shown in FIG. 9.

FIG. 10 is a graph illustrating an output voltage of the DAC shown in FIG. 9. X axis represents the analog signal AN_OUT of the DAC corresponding to the applied digital signal, and Y axis represents the voltage level of the analog signal AN_OUT. Also, a reference symbol "★" represents the analog output of the ideal DAC, and a reference symbol "○" represents the analog output of the actually-implemented DAC.

Referring to FIGS. 9 and 10, the fine gradation voltage generator 920 receives the voltages $V_{H1}$ and $V_{L1}$ applied on both terminals of the resistor RN of the coarse gradation voltage generator 820 and divides the voltages. At this point, due to the turn-on resistance of the switch in the first decoder 840, the voltage level $V_N$ of the first output signal $AN\_OUT_N$ rises higher than the level $V_{ORG\_N}$ of the expected first output signal, and the voltage level of the last output signal $AN\_OUT_{N+3}$ drops lower than the voltage level $V_{ORG\_N+3}$ of the expected last output signal. Also, the voltage level $V_N$ of the first output signal $AN\_OUT_N$ rises and the voltage level $V_N$ of the last output signal $AN\_OUT_{N+3}$ drops. Therefore, the voltage levels of the signals $AN\_OUT_{N+1}$ and $AN\_OUT_{N+2}$, which are divided through the resistors $R_{ch12}$ and $R_{ch13}$ arranged in series between the output node of the first voltage $V_N$ and the output node of the last voltage $V_{N+3}$, are also higher or lower than the expected voltage levels.

The voltage level difference ($V_N-V_{N-1}$) between the voltage $V_{N-1}$ of the last analog signal $AN\_OUT_{N-1}$ and the voltage $V_N$ of the first analog signal $AN\_OUT_N$ are greater than the voltage level difference corresponding to 1-bit digital signal.

That is, it can be seen that voltage level gaps of the analog signals are not equal due to the turn-on resistance of the switches within the first decoder 840.

Meanwhile, the problem due to the turn-on resistance of the MOS switch can be solved by extending the width of the MOS switch making the size of the resistor string of the fine gradation voltage generator larger. However, this may cause the increase of the circuit area and serves as a limit factor in the conversion speed of the DAC.

Accordingly, in the resistor string of the fine gradation voltage generator 920, one resistance of the two resistors connected to the first decoder 840 is added to the turn-on resistance of the entire switch within the first decoder 840 in order to equalize the voltage level gaps of the analog signal. In this manner, it is adjusted to meet the resistance $R_{ch}$ proposed in Equation 1. That is, the resistance can be expressed as $$R_{ch}'=R_{ch}-R_{SW\_TOTAL} \quad \text{(Eq. 7)}$$

In Equation 7, $R_{ch}'$ denotes the resistance adjusted by one of the resistors connected to the first decoder, and $R_{ch}$ denotes the resistance of the fine gradation voltage generator, which is calculated by Equation 7. Also, $R_{SW\_TOTAL}$ denotes the turn-on resistance of all the switches in the first decoder.

Figure 11:
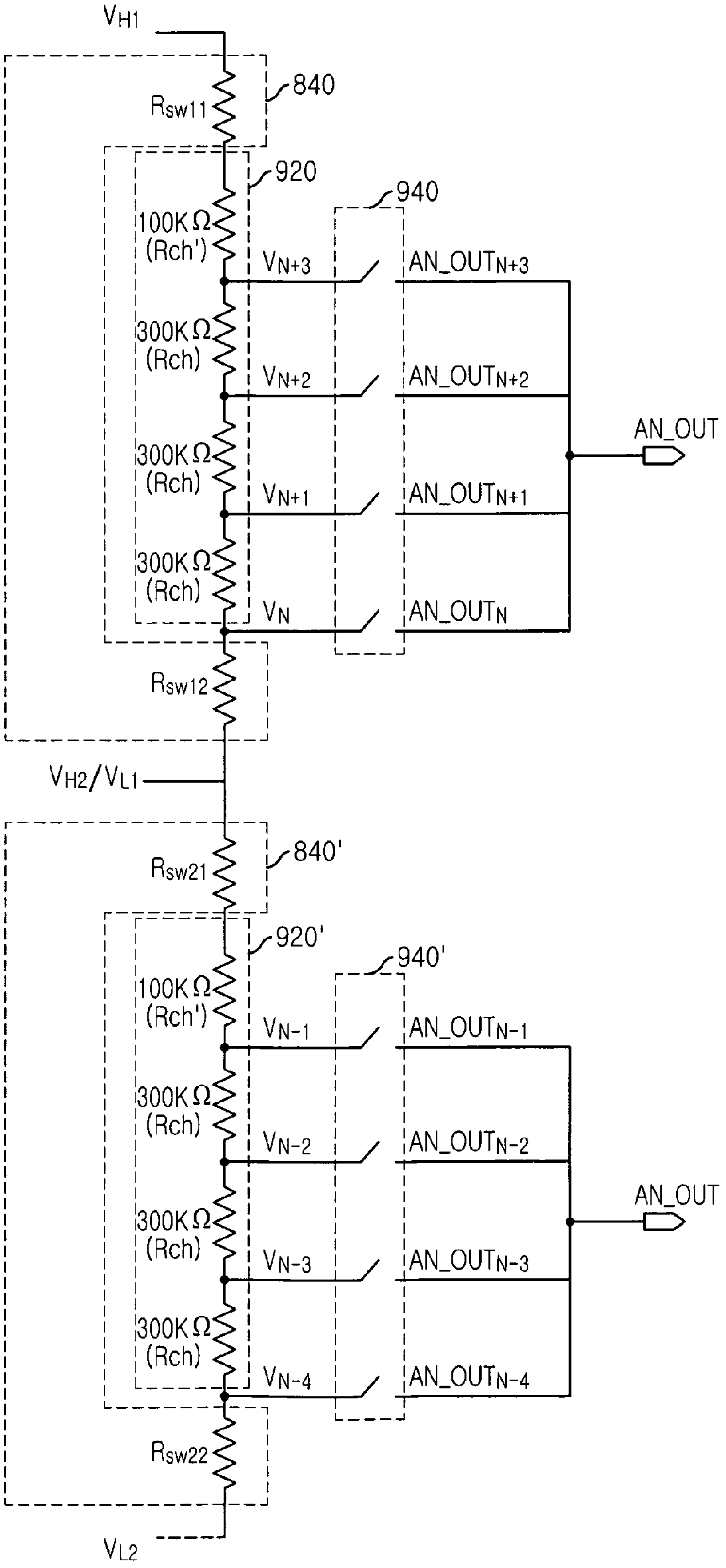
FIG. 11 is an equivalent circuit diagram of the DAC when a first resistance of resister string is adjusted.

FIG. 11 is an equivalent circuit diagram of the DAC when the first resistance of resister string is adjusted.

As shown in FIG. 11, the resistance of the resistor string in the fine gradation voltage generator 920 is calculated based on Equation 1 and one resistance $R_{ch}$ of the resistor string is 300 KΩ. Also, the total resistance of the switches in the first decoder 840 is 200 KΩ. Therefore, the first resistance $R_{ch}'$ of the resistor string in the fine gradation voltage generator 920 is 100 KΩ.

Figure 12:
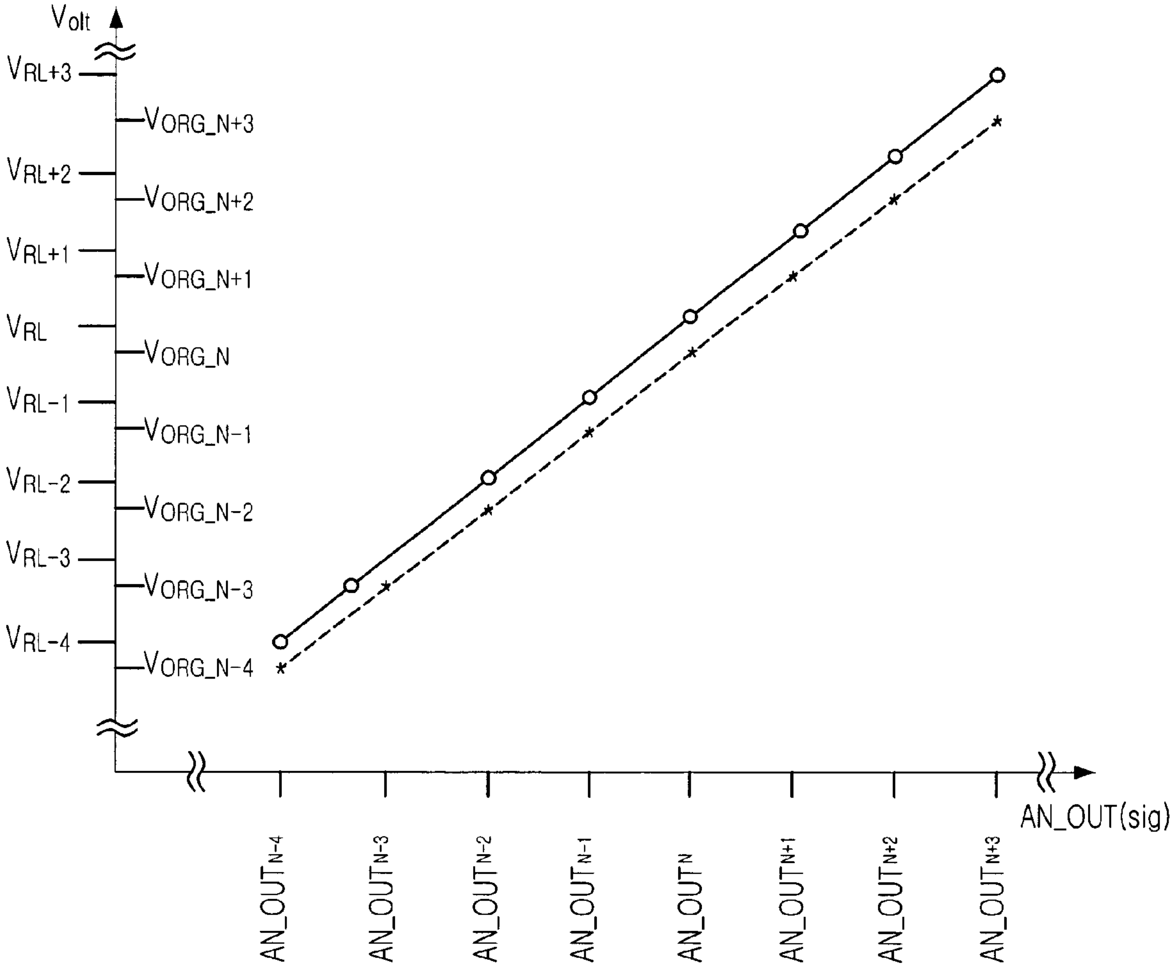
FIG. 12 is a graph illustrating an output voltage of the DAC shown in FIG. 11.

FIG. 12 is a graph illustrating the output voltage of the DAC shown in FIG. 11.

Referring to FIG. 12, the voltage level $V_{RL}$ of the analog signal of the DAC implemented considering the resistance of the first decoder 840 is slightly higher than the analog signal of the ideal DAC as a whole. However, the rising level is the same as the resistance of the switches disposed at one side of the first decoder 840. Consequently, the analog signal of the DAC in accordance with the present invention has the equal voltage level difference.

That is, the differential non-linearity (DNL) is equal. Here, the DNL is the voltage level difference of the analog signal outputted from the DAC.

If adjusting the upper voltage $V_{REF\_H}$ and the lower voltage $V_{REF\_L}$ supplied to the coarse gradation voltage generator 820, the analog signal of the DAC can have the same voltage level as the analog signal of the ideal DAC.

Meanwhile, since the resistance of the rear stage is adjusted when the DAC is implemented in two-stage parallel structure, each stage can be connected without any unity gain amp. Accordingly, since it is possible to remove the limit of the accuracy of the DAC due to the offset voltage of the conventional unity gain amp, the DAC having the high accuracy can be implemented. In addition, the unity gain amp required in the respective channels can be removed, thus reducing the area.

Further, the constant gradation gaps can be made by adjusting the resistance of the resistors connected to the first decoder in the fine gradation voltage generator, considering the resistance of the switches between the respective stages.

Although the TFT-LCD has been described as one example, the present invention can also be applied to a TFT-OELD.

In accordance with the inventive source driver, the DAC having the two-stage parallel structure can be implemented by adjusting the resistance of the resistor string of the rear stage without any unity gain amp. Therefore, the accuracy and the resolution can be improved and the chip area can be reduced. Further, the analog signals having the equal gradation gaps can be outputted by adjusting one resistance of the resistor string contained in the DAC of the rear stage.

The present application contains subject matter related to Korean patent application No. 2004-60389, filed in the Korean Patent Office on Jul. 30, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A TFT-LCD source driver for driving L channels of a liquid crystal panel (where L is a positive integer), the TFT-LCD source driver comprising L DACs (digital-to-analog converters) for converting (M+N)-bit different digital signals into analog signals (where M and N are positive integers), the DAC comprising:

a coarse gradation voltage generator, configured with $2^M$ resistors connected in series, for generating $2^M$ gradation voltages;

a first decoder for selecting two consecutive voltages among the $2^M$ gradation voltages in response to M-bit digital signals;

a fine gradation voltage generator, configured with $2^N$ resistors connected in series, for receiving output voltages of the first decoder and outputting $2^N$ gradation voltages; and a second decoder for selecting one of the $2^N$ gradation voltages in response to the N-bit digital signals and outputting the selected gradation voltage as the analog signal, wherein the L DACs share the coarse gradation voltage generator, the first decoder and the fine gradation voltage generator are connected together without a unity gain amp, and a resistance ($R_{ch}$) of the fine gradation voltage generator meets an equation $$R_{ch} \geq \frac{(2^M - 1) \cdot L \cdot R}{2^M \cdot 2^N},$$

where R is a resistance of the coarse gradation voltage generator.

2. The source driver as recited in claim 1, wherein if the coarse gradation voltage generator has various resistances, the resistance R is the largest resistance among the various resistances.

3. The source driver as recited in claim 2, wherein when one resistance of the two resistors connected to the first decoder in a resistor string of the fine gradation voltage generator is added to a turn-on resistance of all switches contained in the first decoder, the added resistance meets the equation.

4. An apparatus for converting a digital signal into an analog signal, comprising:

L DACs (digital-to-analog converters) including:

a first decoder for selecting two consecutive voltages among $2^M$ gradation voltages in response to M-bit digital signals (where L and M are positive integers);

a fine gradation voltage generator, configured with $2^N$ resistors connected in series, for receiving output voltages of the first decoder and outputting $2^N$ gradation voltages (where N is a positive integer); and a second decoder for selecting one of the $2^N$ gradation voltages in response to the N-bit digital signals and outputting the selected gradation voltage as the analog signal; and a coarse gradation voltage generator, configured with $2^M$ resistors connected in series, for generating the $2^M$ gradation voltages, wherein the first decoder and the fine gradation voltage generator are connected together without a unity gain amp; and a resistance ($R_{ch}$) of the fine gradation voltage generator meets an equation $$R_{ch} \geq \frac{(2^M - 1) \cdot L \cdot R}{2^M \cdot 2^N},$$

where R is a resistance of the coarse gradation voltage generator.

5. The apparatus as recited in claim 4, wherein if the coarse gradation voltage generator has various resistances, the resistance R is the largest resistance among the various resistances.

6. The apparatus as recited in claim 5, wherein when one resistance of two resistors connected to the first decoder in a resistor string of the fine gradation voltage generator is added to a turn-on resistance of all switches contained in the first decoder, the added resistance meets the equation.

* * * * *